(12) United States Patent
Nakatsuji et al.

(10) Patent No.: US 11,683,985 B2
(45) Date of Patent: Jun. 20, 2023

(54) THERMOELECTRIC CONVERSION ELEMENT AND THERMOELECTRIC CONVERSION DEVICE

(71) Applicant: The University Of Tokyo, Tokyo (JP)

(72) Inventors: Satoru Nakatsuji, Tokyo (JP); Akito Sakai, Tokyo (JP)

(73) Assignee: THE UNIVERSITY OF TOKYO, Tokyo (JP)

( * ) Notice: Subject to any disclaimer, the term of this patent is extended or adjusted under 35 U.S.C. 154(b) by 210 days.

(21) Appl. No.: 16/626,937

(22) PCT Filed: Jul. 3, 2018

(86) PCT No.: PCT/JP2018/025276
§ 371 (c)(1),
(2) Date: Feb. 24, 2020

(87) PCT Pub. No.: WO2019/009308
PCT Pub. Date: Jan. 10, 2019

(65) Prior Publication Data
US 2020/0212282 A1 Jul. 2, 2020

Related U.S. Application Data

(60) Provisional application No. 62/528,236, filed on Jul. 3, 2017.

(51) Int. Cl.
*H01L 35/32* (2006.01)
*H01L 35/04* (2006.01)
(52) U.S. Cl.
CPC .............. *H01L 35/32* (2013.01); *H01L 35/04* (2013.01)

(58) Field of Classification Search
CPC .......... H01L 37/00; H01L 35/04; H01L 35/32
See application file for complete search history.

(56) References Cited

U.S. PATENT DOCUMENTS 9,643,385 B1 * 5/2017 Butler ..................... C22C 27/00

FOREIGN PATENT DOCUMENTS

| JP | 2014072256 A | * | 4/2014 |
| JP | 6079995 B2 | | 2/2017 |
| JP | 2017-084854 A | | 5/2017 |

OTHER PUBLICATIONS

Machine translation of JP-2014072256-A, Sakuraba Yuuya. (Year: 2014).*

(Continued)

*Primary Examiner* — Mayla Gonzalez Ramos
(74) *Attorney, Agent, or Firm* — Fox Rothschild LLP

(57) ABSTRACT

A thermoelectric conversion element is made of a material with a band structure having Weyl points in the vicinity of Fermi energy. The thermoelectric conversion element has a thermoelectric mechanism for generating electromotive force by the anomalous Nernst effect. A thermoelectric conversion device includes a substrate; and a power generator provided on the substrate and including a plurality of thermoelectric conversion elements. Each of the plurality of thermoelectric conversion elements has a shape extending in one direction, and is made of a material identical to that of the above-mentioned thermoelectric conversion element. The plurality of thermoelectric conversion elements is arranged in parallel to one another in a direction perpendicular to the one direction and electrically connected in series to one another in a serpentine shape.

9 Claims, 16 Drawing Sheets

(56) References Cited

OTHER PUBLICATIONS

D P Rai, Sandeep, A Shankar, Anup Pradhan Sakhya, T P Sinha, R Khenata, M P Ghimire and R K Thapa, "Electronic and magnetic properties of X2YZ and XYZ Heusler compounds: a comparative study of density functional theory with different exchange-correlation potentials", Mater. Res. Express 3 (2016) (Year: 2016).*
Extended European Search Report issued in European Patent Application EP18827510.1 dated Mar. 9, 2021.
Pallab Goswami et al: "Itinerant spin ice order, Weyl metal, and anomalous Hall effect in Pr 2lr 20 7", arxiv.org, Cornell University Library, 201 Olin Library Cornell University Ithaca, NY 14853, Mar. 7, 2016 (Mar. 7, 2016).
Tian Liang et al: "Anomalous Hall Effect in ZrTe5", arxiv.org, Cornell University Library, 201 Olin Library Cornell University Ithaca, NY 14853, Dec. 21, 2016 (Dec. 21, 2016).
Sarah J Watzman et al: "Dirac dispersion generates large Nernst effect in Weyl semimetals", arxiv.org, Cornell University Library, 201 Olin Library Cornell University Ithaca, NY 14853, Mar. 14, 2017 (Mar. 14, 2017).
International Search Report dated Sep. 18, 2018 in PCT/JP2018/025276.
Fukui, Takahiro et al.: "Chem Numbers in Discretized Brillouin Zone: Efficient Method of Computing (Spin) Hall Conductances" Mar. 8, 2005, Journal of The Physical Society of Japan vol. 74, No. 6, Jun. 2005, pp. 1674-1677 #2005 The Physical Society of Japan.
Ferreiras, Ago et al.: "Anomalous Nernst and Thermal Hall E ects in Tilted Weyl Semimetals", Nov. 21, 2017 Department of Physics, KTH Royal Institute of Technology, SE-106 91 Stockholm, Sweden Ioffe Physical-Technical Institute, 194021 St. Petersburg, Russia, Max-Planck-Institut fur Physik komplexer Systeme, 01187 Dresden, Germany.
Sakuraba, Yuya: "Potential of Thermoelectric Power Generation Using Anomalous Nernst Effect in Magnetic Materials" Scripta Materialia, Jun. 3, 2015, 111, pp. 29-32.

* cited by examiner

Exp(EXPERIMENT): $T_0$=550K; B=2T
DFT CALCULATION: $T_0$=6000K; M∥[100]

$$\alpha_{yx}(T,\mu) = \frac{k_B^2 eT_0}{12\hbar^2 v_1} G\left(\frac{T}{T_0}, \frac{\mu - E_0}{k_B T_0}\right)$$

THERMOELECTRIC CONVERSION ELEMENT AND THERMOELECTRIC CONVERSION DEVICE

TECHNICAL FIELD

The present invention relates to a thermoelectric conversion element and a thermoelectric conversion device including the thermoelectric conversion element.

BACKGROUND ART

In recent years, there has been proposed thermoelectric conversion devices using the anomalous Nernst effect (see Patent Literature 1, for example). The anomalous Nernst effect is a phenomenon observed when heat current flowing through a magnetic material creates a temperature difference, which generates an electric voltage in a direction perpendicular to both a direction of magnetization and a temperature gradient.

The Seebeck effect is well known as a thermoelectric mechanism that also generates an electric voltage due to a temperature gradient. The Seebeck effect generates the electric voltage in a direction of the temperature gradient, which causes a complicated three-dimensional structure of thermoelectric modules. This makes it difficult to achieve large-area thermoelectric modules and film-shaped thermoelectric modules. In addition, toxic and rare materials are used in the Seebeck effect, leading to fragile, vibration sensitive modules, and a high manufacturing cost. In contrast, the anomalous Nernst effect generates the electric voltage in the direction perpendicular to the temperature gradient, which enables a lateral configuration of thermoelectric modules to cover a heat source. Such a configuration is advantageous for achieving large-area thermoelectric modules and film-shaped thermoelectric modules. Further, inexpensive, low-toxicity, highly durable materials can be selected for the anomalous Nernst effect.

CITATION LIST

Patent Literature

Patent Literature 1: Japanese Patent No. 6,079,995

SUMMARY OF INVENTION

Technical Problem

Although the anomalous Nernst effect has advantages over the Seebeck effect as described above, the current power generation capacity by the anomalous Nernst effect using typical magnetic materials is still insufficient for practical applications.

In view of the foregoing, an object of the present invention is to provide a thermoelectric conversion element that can exhibit a much larger anomalous Nernst effect than ever before, and to provide a thermoelectric conversion device including the thermoelectric conversion element.

Solution to Problem

A thermoelectric conversion element according to a first aspect of the present invention is made of a material with a band structure having Weyl points in the vicinity of Fermi energy. The thermoelectric conversion element has a thermoelectric mechanism for generating electromotive force by the anomalous Nernst effect.

A thermoelectric conversion device according to a second aspect of the present invention includes a substrate, and a power generator provided on the substrate and including a plurality of thermoelectric conversion elements. Each of the plurality of thermoelectric conversion elements has a shape extending in one direction, and is made of a material with a band structure having Weyl points in the vicinity of the Fermi energy. In the power generator, the plurality of thermoelectric conversion elements is arranged in parallel to one another in a direction perpendicular to the one direction and electrically connected in series to one another in a serpentine shape.

A thermoelectric conversion device according to a third aspect of the present invention includes: a thermoelectric conversion element made of a material with a band structure having Weyl points in the vicinity of the Fermi energy; and a hollow member. The thermoelectric conversion element is a sheet-shaped element covering an outer surface of the hollow member.

Advantageous Effect of Invention

According to the present invention, it is possible to achieve a much larger anomalous Nernst effect than ever before by using a thermoelectric conversion element made of a material whose band structure has Weyl points in the vicinity of Fermi energy.

DESCRIPTION OF EMBODIMENT

Exemplary embodiments of the present invention will be described below with reference to the accompanying drawings.

In recent years, it is theoretically known that topological electronic structures relate to a thermoelectric mechanism based on the anomalous Nernst effect. In particular, recent studies have indicated that the Berry curvature of Weyl points residing in the vicinity of Fermi energy $E_F$ can potentially enhance the anomalous Nernst effect, and it is therefore expected that search for materials containing the Weyl fermions and new material synthesis are effective in development of a thermoelectric conversion device using the anomalous Nernst effect.

Figure 1:
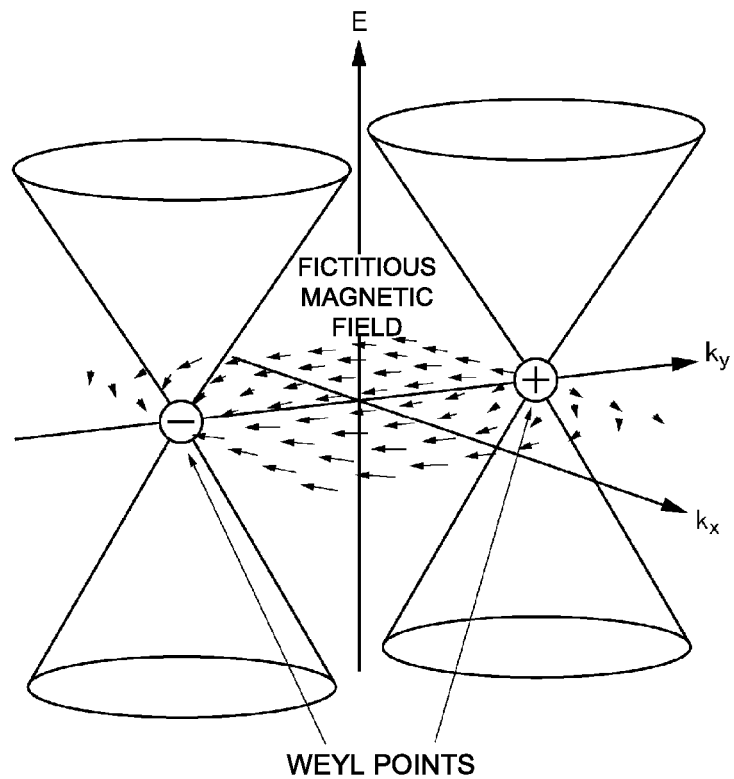
FIG. 1 is a schematic view of a band dispersion indicating a relation between energy and momentum of Weyl fermions.

The Weyl fermions are massless fermions defined by the Dirac equation. As shown in FIG. 1, the Weyl points are present at intersections of linear band dispersions and appear in pairs with opposite chirality (right handed and left handed). A pair of Weyl points can be regarded as positive and negative magnetic poles in a fictitious magnetic field (Berry curvature) in a momentum space and is considered to affect motion of electrons in a material, as with magnetic fields in a real space.

Recent first-principles calculations have shown that metals with composition $Co_2TX$ are potential Weyl metals in which Weyl points exist in the momentum space near the Fermi energy $E_F$. Here, T is a transition metal, and X is one of Si, Ge, Sn, Al, and Ga. As an example of such metals, the following embodiments are directed to $Co_2MnGa$, which is a full Heusler ferromagnet.

Figure 2:
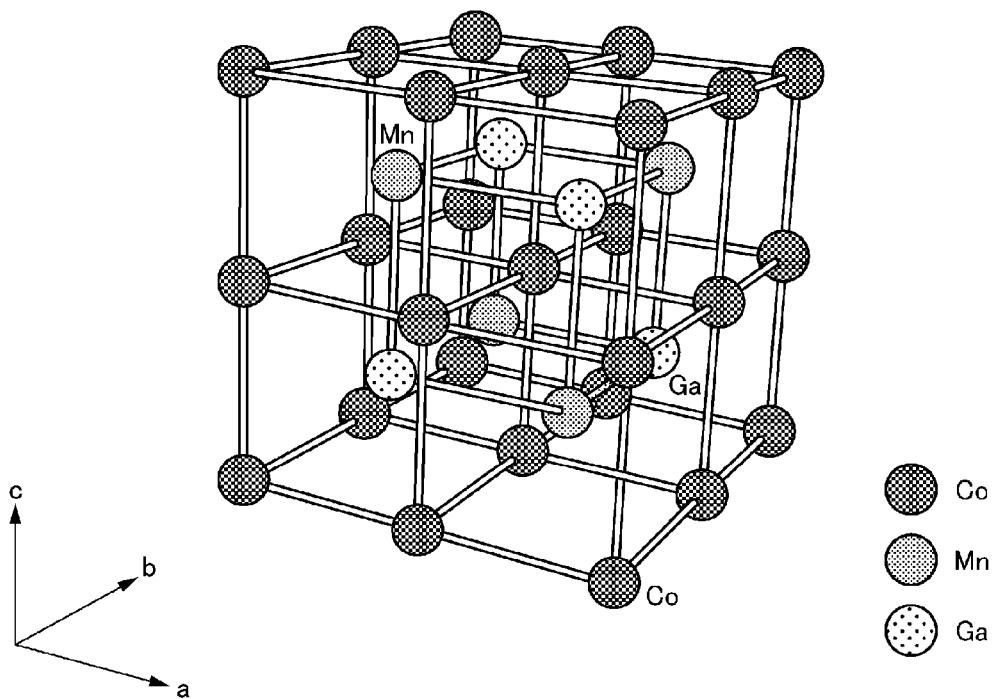
FIG. 2 is a schematic view of a crystal structure of $Co_2MnGa$.

FIG. 2 schematically shows a crystal structure of $Co_2MnGa$. $Co_2MnGa$ has a $L2_1$-type cubic full Heusler structure as shown in FIG. 2. A unit cell of the $L2_1$ structure consists of four face-centered cubic (fcc) sublattices with Co atoms at (¼, ¼, ¼) and (¾, ¾, ¾), Mn atom at (0, 0, 0) and Ga atom at (½, ½, ½) in a lattice coordinate system. The crystal structure of $Co_2MnGa$ can be determined by a variety of diffraction methods, such as X-ray diffraction.

Figure 3:
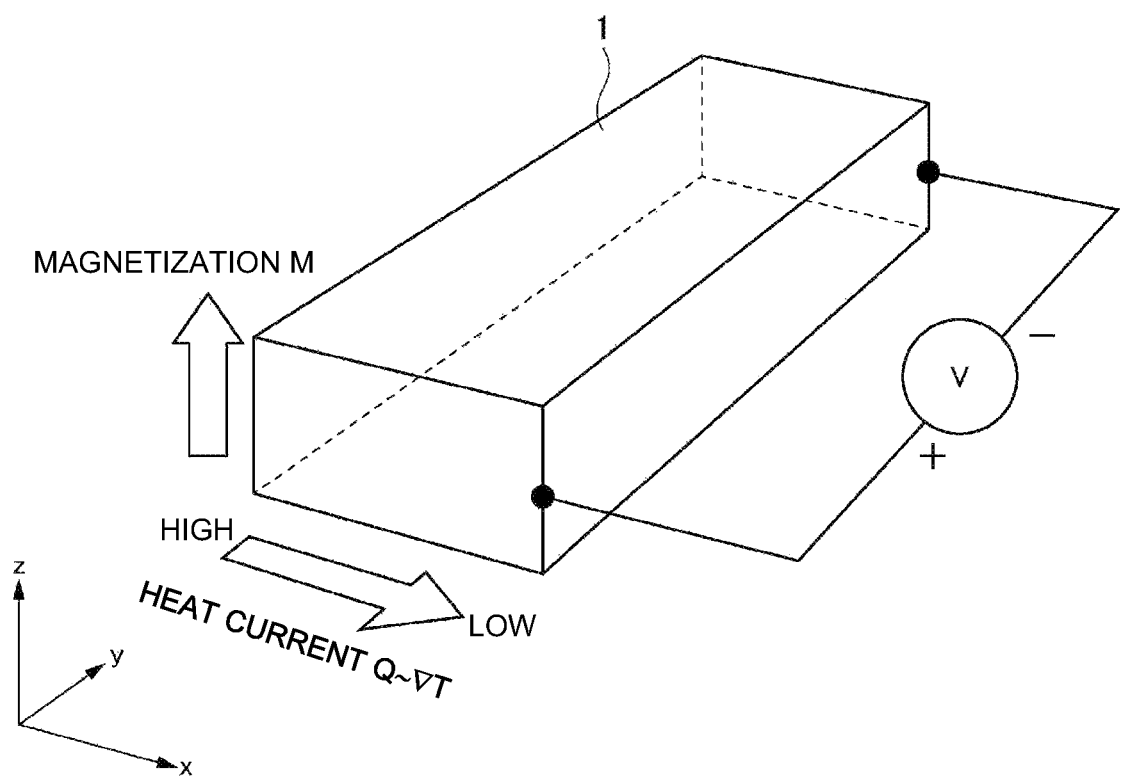
FIG. 3 is a schematic view of a configuration of a thermoelectric conversion element according to embodiments of the present invention.

Next, a thermoelectric conversion element according to the embodiments of the present invention and a thermoelectric mechanism thereof will be described with reference to FIG. 3. As shown in FIG. 3, an assumption is made that a thermoelectric conversion element 1 according to the embodiments is made of $Co_2MnGa$, has a box shape extending in one direction (direction y), has a thickness (length in a direction z) greater than or equal to 0.1 μm, and is magnetized in a direction +z. When heat current Q (~∇T) flows through the thermoelectric conversion element 1 in a direction +x, a temperature difference is created in the direction +x. As a result, the anomalous Nernst effect generates electromotive force V (~M×∇T) in the thermoelectric conversion element 1 in an outer product direction (direction y) perpendicular to both the direction of the heat current Q (direction +x) and the direction of magnetization M (direction +z).

Reference will now be made to a verification experiment of the anomalous Nernst effect of the thermoelectric conversion element 1.

Single crystals of $Co_2MnGa$ were prepared by the Czochralski method after making polycrystalline samples by arc-melting Co, Mn, and Ga with an appropriate ratio. X-ray diffraction showed that the produced $Co_2MnGa$ had a lattice constant a=5.77(3) angstroms. In the experiment, three box-shaped samples with a size of 7.5×2.0×1.3 $mm^3$ were produced as the thermoelectric conversion element 1. The three samples are distinguished according to crystal orientations parallel to directions of magnetic fields B, and a B∥[100] sample, a B∥[110] sample, and a B∥[111] sample are denoted by #100, #110, and #111, respectively. In the embodiments, transport phenomena (the Nernst effect, the Seebeck effect, and the Hall effect) were measured for each sample by using a known method.

FIGS. 4 to 6A show the results of the measurement of the Nernst effect, the Seebeck effect, and the Hall effect for each sample.

Figure 4:
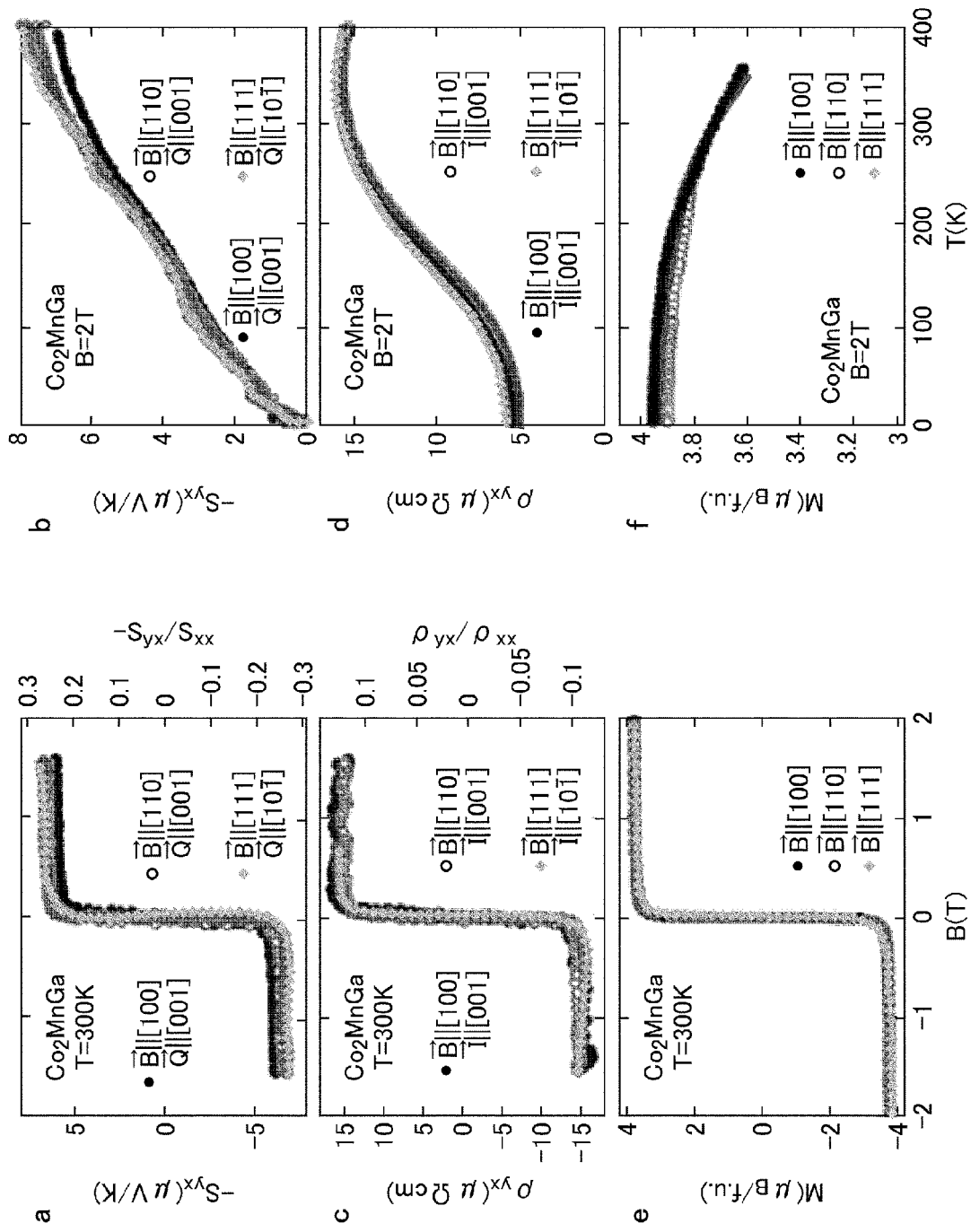
FIG. 4 shows graphs illustrating results of measurement of magnet field dependence and temperature dependence of the Nernst effect, the Hall effect, and magnetization of the thermoelectric conversion element.

A graph a in FIG. 4 shows magnetic field dependence of a Nernst coefficient $-S_{yx}$ at room temperature (T=300 K) and shows observational results obtained when a magnetic field B parallel to [100], a magnetic field B parallel to [110], and a magnetic field B parallel to [111] are applied to the samples and the heat current Q parallel to [001] or [10-1] flows through the samples. A graph b in FIG. 4 shows temperature dependence of $-S_{yx}$ obtained when a magnetic field B=2 T is applied to each of the samples. As is clear from the graph b in FIG. 4, $-S_{yx}$ increases with elevating temperature, reaches $|S_{yx}|$~6 μV/K at room temperature, and even approaches $|S_{yx}|$~8 μV/K at 400 K, which are one order of magnitude larger than typical observed values known for the anomalous Nernst effect.

Figure 5:
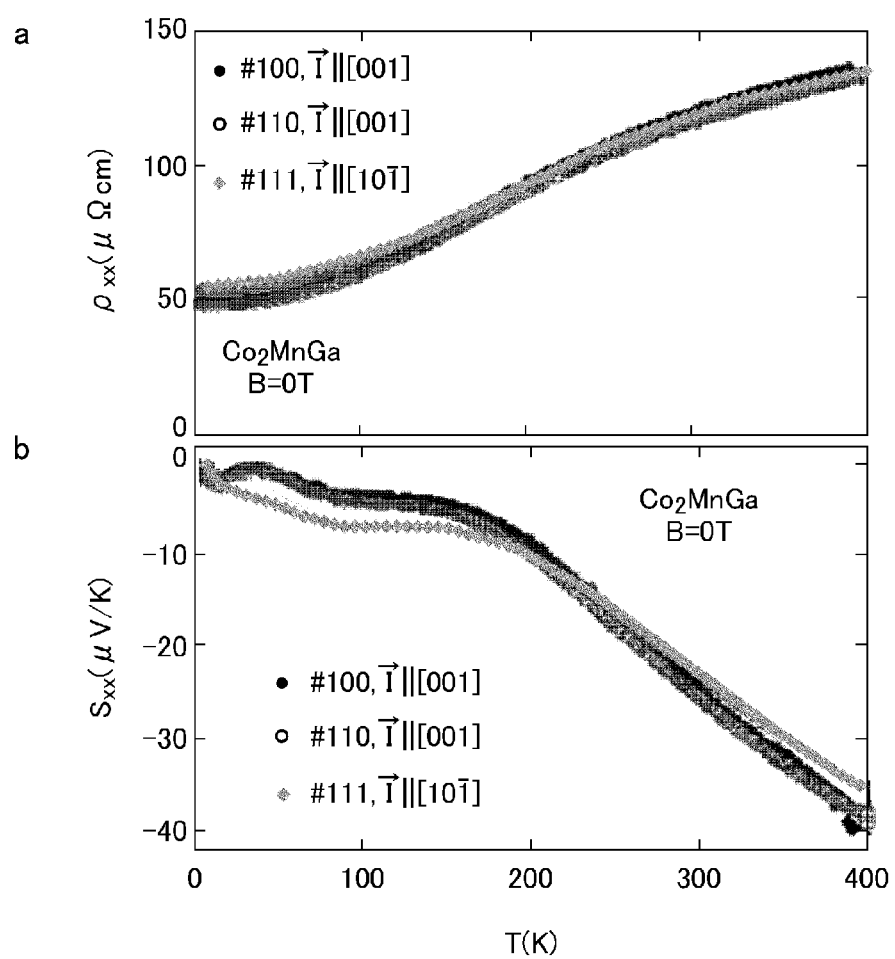
FIG. 5 shows graphs illustrating temperature dependence of longitudinal resistivity and the Seebeck coefficient of the thermoelectric conversion element at zero magnetic field.

A ratio of the observed value $-S_{yx}$ to the Seebeck coefficient $S_{xx}$ indicated by a graph b in FIG. 5 (namely, the Nernst angle $\theta_N \approx \tan \theta_N = S_{yx}/S_{xx}$) is also an unprecedented large value. In fact, $|S_{yx}/S_{xx}|$ is greater than 0.2, as shown by a right vertical axis of the graph a in FIG. 4. The graphs a and b in FIG. 4 further indicate that there is almost no anisotropy in $S_{yx}$.

As shown in graphs c and d of FIG. 4, the Hall resistivity $\rho_{yx}$ reaches 15 μΩcm at room temperature and reaches a maximum 16 μΩcm around 320 K. The Hall angle $\theta_H \approx \tan \theta_H = \rho_{yx}/\rho_{xx}$ (a right vertical axis of the graph c in FIG. 4) is also large and exceeds 0.1 at room temperature. Here, $\rho_{xx}$ is longitudinal resistivity. A graph a in FIG. 5 shows temperature dependence of $\rho_{xx}$ at zero magnetic field.

Graphs e and f in FIG. 4 show magnetic field dependence of the magnetization M at room temperature and temperature dependence of the magnetization M at magnetic field B=2 T, respectively. The graphs a, c, and e in FIG. 4 show that the Hall effect and the Nernst effect have nearly the same magnetic field dependence as that of the magnetization curve. This indicates that the anomalous contribution ($\propto M$) to the Hall effect and the Nernst effect is dominant and the normal contribution ($\propto B$) is negligibly small at T=300 K. As indicated by the graphs e and f in FIG. 4, saturated magnetization Ms reaches 3.8 $\mu_B$ at T=300 K, gradually grows on cooling, and reaches about 4 $\mu_B$ at T=5 K, which is consistent with the predicted value based on the Slater-Pauling rule. The graphs e and f in FIG. 4 indicate that the anisotropy for the magnetization is negligibly small at T=300 K, which is fully consistent with the cubic structure.

Figure 6A:
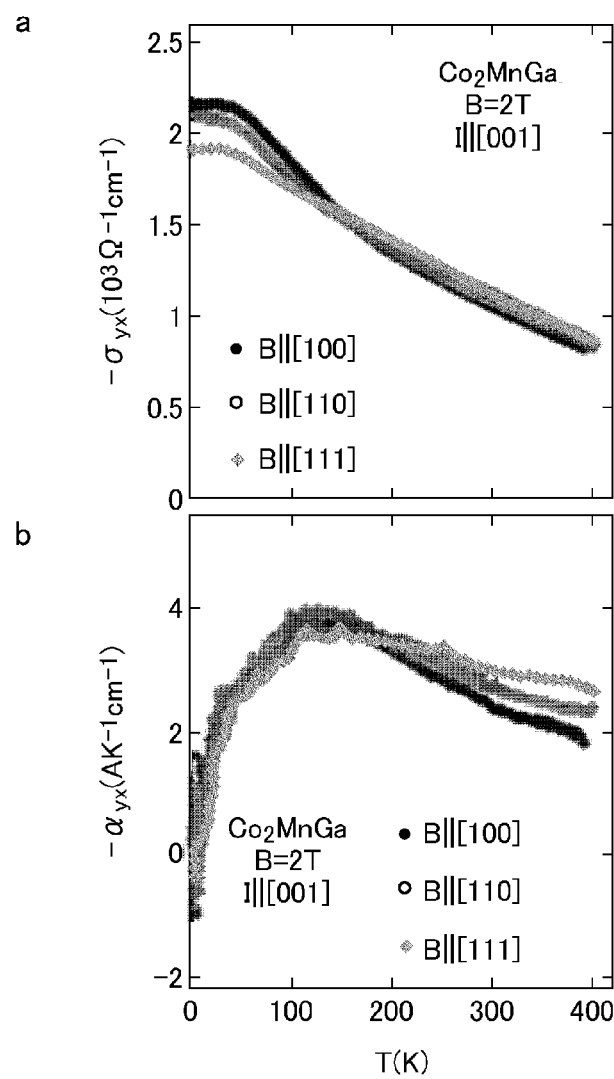
FIG. 6A shows graphs illustrating temperature dependence of Hall conductivity and the Peltier coefficient of the thermoelectric conversion element.

The observed Hall resistivity $|\rho_{yx}|\sim 15$ $\mu\Omega$cm is one of the largest known for the anomalous Hall effect. Similarly, the Hall conductivity is also exceptionally large. A graph a in FIG. 6A shows temperature dependence of the Hall conductivity $\sigma_{yx}$ at B=2 T. Here, $\sigma_{yx}=-\rho_{yx}/(\rho xx^2+\rho_{yx}^2)$ is satisfied. $-\sigma_{yx}$ monotonically increases on cooling and reaches $-\sigma_{yx}\sim 2000$ $\Omega^{-1}$cm$^{-1}$ at absolute zero. This value is of the same order of magnitude as the one known for the layered quantum Hall effect.

The Nernst coefficient $S_{yx}$ can be defined by the Peltier coefficient $\alpha_{yx}$. In general, electric current is generated by both electric field $\varepsilon$ and temperature gradient $\nabla T$ and expressed by $J=\sigma\cdot\varepsilon-\alpha\cdot\nabla T$. Here, J, $\sigma$ and $\alpha$ are an electric current density tensor, an electric conductivity tensor, and a thermoelectric conductivity tensor, respectively. Assuming that the direction of the magnetic field B is parallel to the direction z and the temperature gradient $\nabla T$ is parallel to the direction x, and setting J=0, the following is obtained: $J_y=\sigma_{yx}S_{xx}+\sigma_{xx}S_{yx}-\alpha_{yx}=0$. Here, a cubic symmetry provides $\sigma_{xx}=\sigma_{yy}$. That is, the Peltier coefficient, which is a transverse thermoelectric coefficient, is given by the following Expression (1):

Peltier coefficient $\alpha_{yx}$=Hall conductivity $\sigma_{yx}\times$Seebeck coefficient $S_{xx}$+longitudinal conductivity $\sigma_{xx}\times$Nernst coefficient $S_{yx}$ (1).

According to Expression (1), the Peltier coefficient determines the magnitude of the Nernst coefficient, and it is effective to evaluate the Peltier coefficient for determination of the anomalous Nernst effect.

A graph b in FIG. 6A shows the results of calculation of temperature dependence of $-\alpha_{yx}$ using Expression (1) and the values obtained from FIGS. 4 and 5 and the graph a in FIG. 6A. As indicated by the graph b in FIG. 6A, $-\alpha_{yx}$ increases almost linearly with T up to T~25 K, reaches a maximum around T~140 K, and then gradually decreases with a rise in T. Notice that the curve of the temperature dependence of $-\alpha_{yx}$ closely resembles $-T \log T$ behavior. In more detail, by plotting data of $-\alpha_{yx}/T$ (right vertical axis of FIG. 6B) against log T, a crossover is found between two distinct behaviors: $-\alpha_{yx}\sim T$ at low temperatures and $-\alpha_{yx}\sim -T \log T$ at high temperatures.

$-\alpha_{yx}\sim T$ behavior at low temperatures is consistent with the Mott formula, which defines the relation between $\alpha_{yx}$ at low temperatures ($k_B T \ll E_F$) and the energy derivative of the Hall conductivity $\sigma_{yx}$ at T=0 ($\alpha_{yx}\sim-(\pi^2 k_B^2 T/3e)$ ($\partial\sigma_{yx}/\partial E_F$)). Here, $k_B$ is the Boltzmann constant. On the other hand, $-\alpha_{yx}\sim -T \log T$ behavior at high temperatures (between T~30 K and T~400 K) indicates violation of the Mott formula. The $-T \log T$ behavior of the thermoelectric coefficient can be understood in terms of Weyl fermions, as will be described below.

Figure 7A:
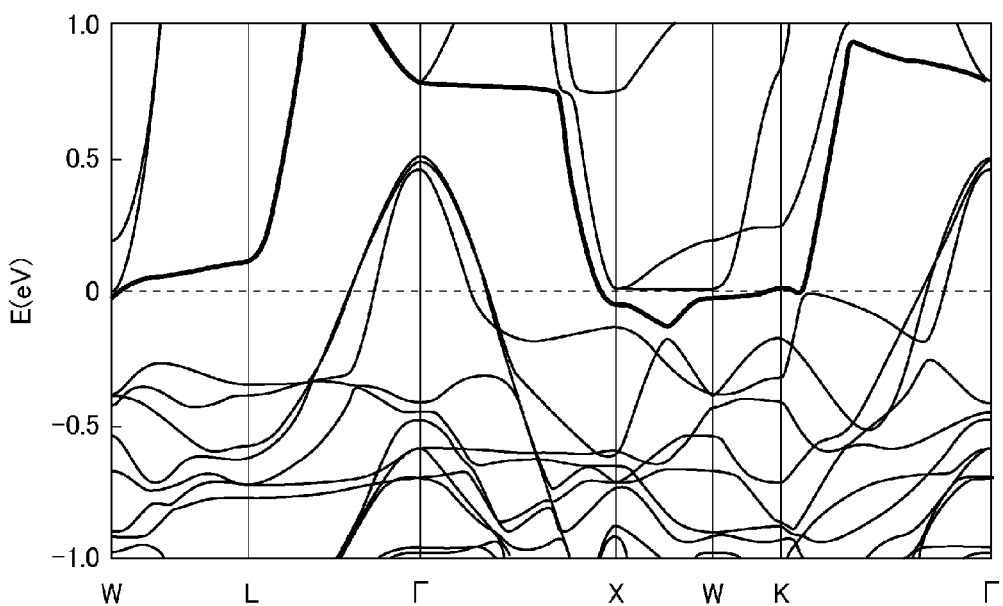
FIG. 7A is a schematic view of a band structure of $Co_2MnGa$ obtained from first-principles calculations.
Figure 7B:
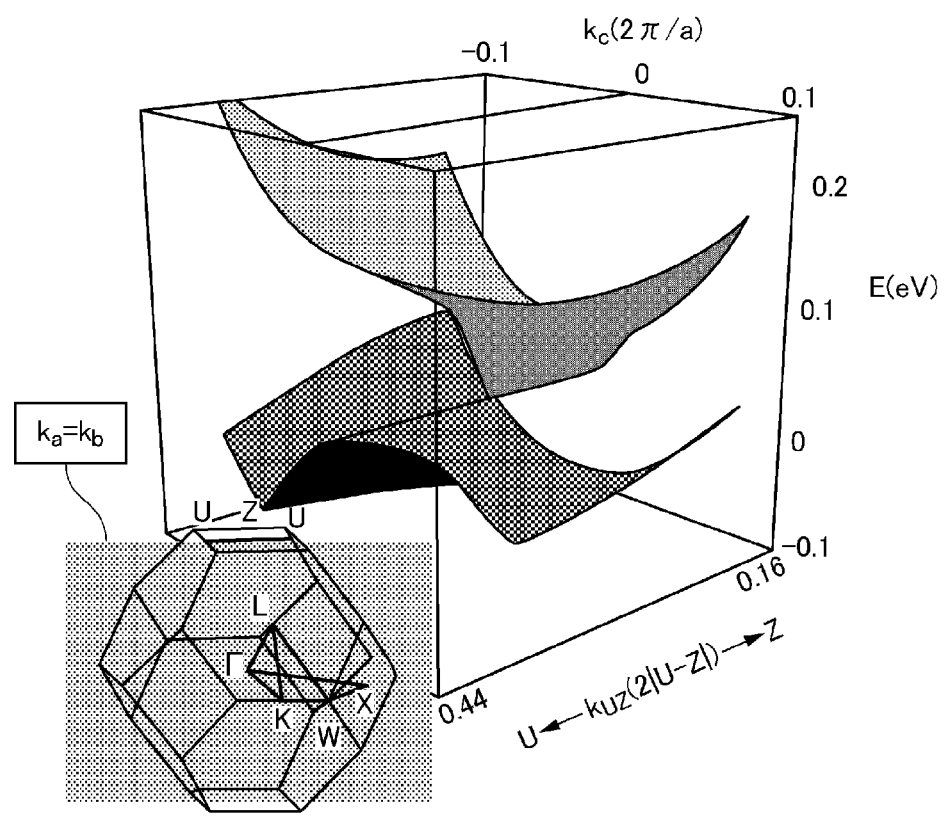
FIG. 7B is a schematic view of a band dispersion of $Co_2MnGa$ near Fermi energy, and an inset indicates a first Brillouin zone and symmetric points of a face-centered cubic lattice.
Figure 7C:
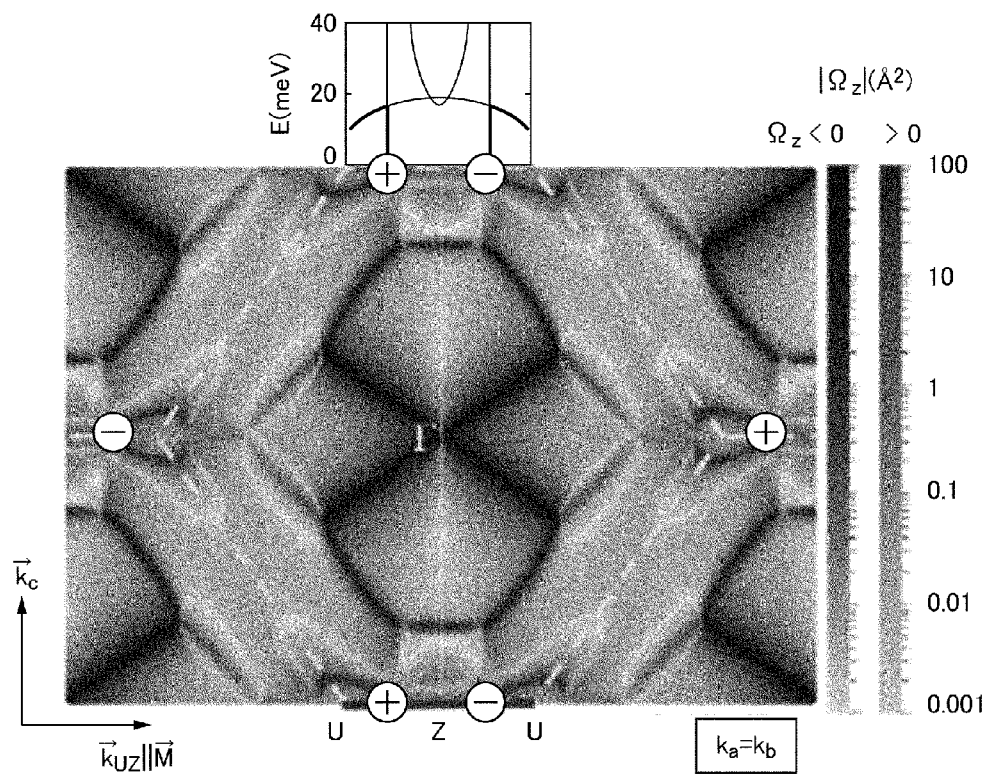
FIG. 7C is a schematic view illustrating a band structure along U-Z-U near energy E~20 meV (top panel) and a distribution of the Berry curvature in a ka=kb plane spanned by momentum $k_{UZ}$ along U-Z and kc (bottom panel).

To provide evidence for the existence of Weyl points, the focus is first put on a Fermi surface closest to the Fermi energy $E_F$ of Co$_2$MnGa. FIG. 7A shows the band structure of Co$_2$MnGa obtained from the first-principles calculations. Here, the magnetization M is 4.2 $\mu_B$, and the magnetization direction is along [110]. In FIG. 7A, a band that forms the largest Fermi surface, which is located near the Brillouin zone boundary and closest to the Fermi energy $E_F$ (=0 eV), is drawn by a thick line. FIGS. 7A to 7C show that the Weyl points (+−) are located around $E_0 \approx 20$ meV in the vicinity of the Fermi energy $E_F$, and this Fermi surface has a large Berry curvature $|\Omega_z|$ in the vicinity of the Weyl points (+−) (FIG. 7C).

FIGS. 7B and 7C show that the Weyl points (+−) are located on the Brillouin zone boundary along U-Z-U line at $\pm k_0=\pm(2\pi/a)\times 0.15$ in a ka=kb plane spanned by the momentum $k_{UZ}$ along U-Z and kc. In FIG. 7C, the distribution of z component of the Berry curvature $|\Omega_z|$ in the ka=kb plane is expressed by grayscale, and the Weyl points (+−) appear at locations where the Berry curvature $|\Omega_z|$ is relatively large (dense portion). The Weyl points can be searched in the Brillouin zone by a method of Fukui-Hatsugai-Suzuki (J. Phys. Soc. Jpn 74, 1674-1677 (2005)).

Figure 8A:
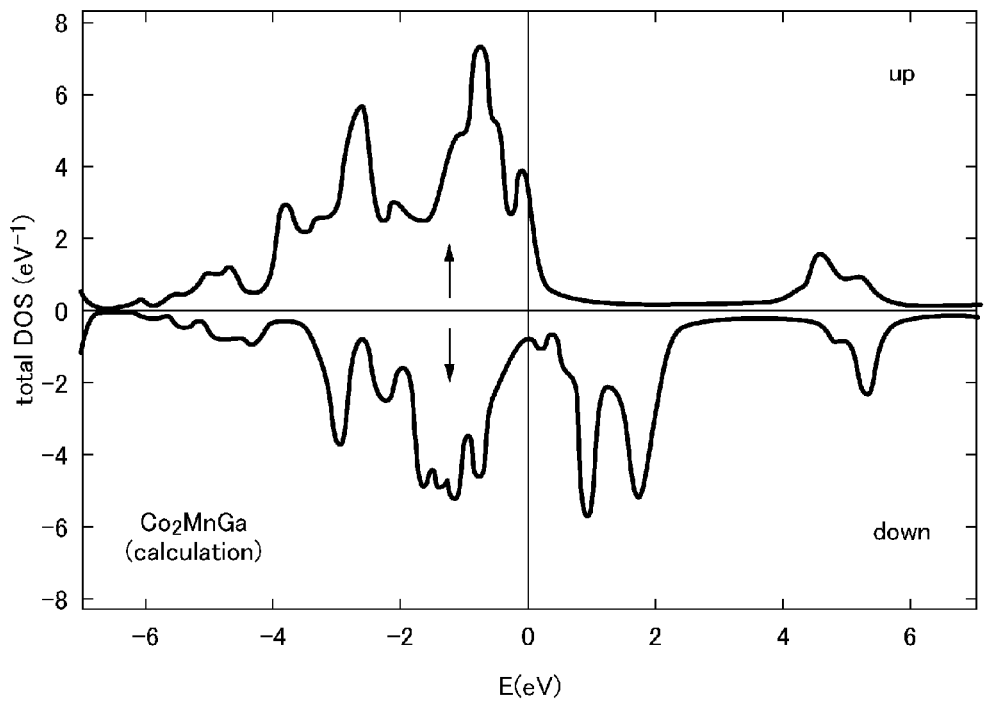
FIG. 8A is a graph illustrating a spin-decomposed density of states of $Co_2MnGa$ obtained from the first-principles calculations.
Figure 8B:
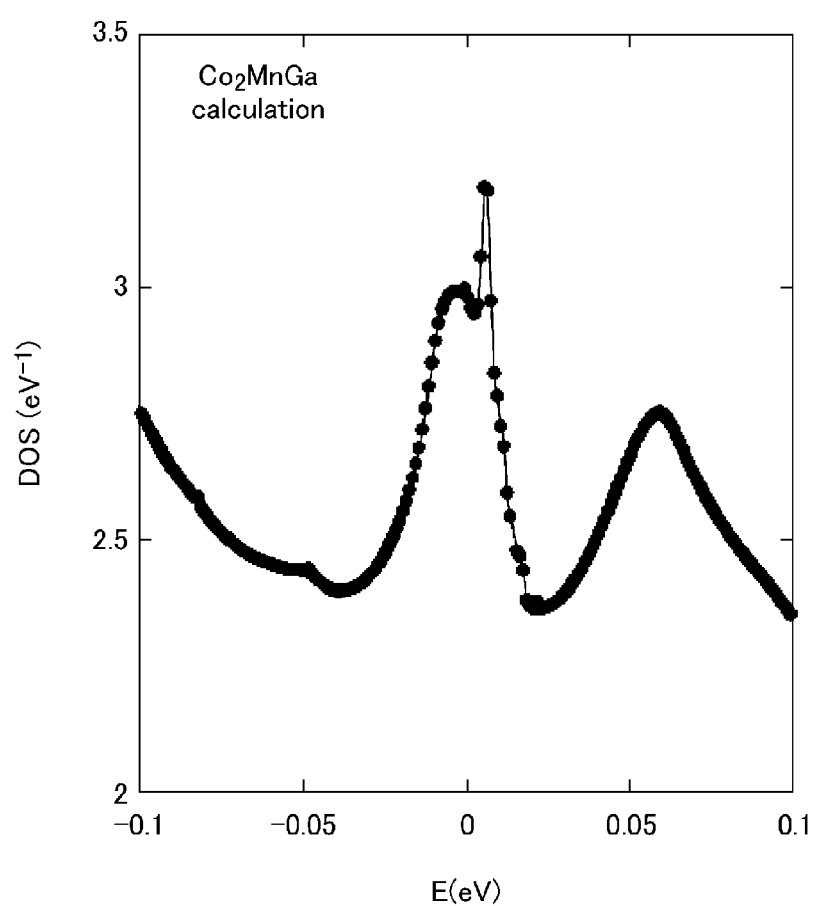
FIG. 8B is a graph illustrating the density of states near the Fermi energy in FIG. 8A.

FIGS. 7A and 7B show that the band that forms the largest Fermi surface and another band intersect with each other to provide linear dispersion in the vicinity of the Fermi energy $E_F$, and density of states (DOS) increases because the dispersions of the two bands are almost flat. FIG. 8A shows a spin-decomposed density of states of Co$_2$MnGa obtained from the first-principles calculations, and FIG. 8B shows the density of states near the Fermi energy $E_F$. As shown in FIG. 8B, the density of states has peaks around the Fermi energy $E_F$ and around 60 meV. That is, the density of states of Co$_2$MnGa has a local maximum value in the vicinity of Fermi energy $E_F$.

The right handed (+) and left handed (−) Weyl fermions are described by low-energy Hamiltonians, as given by Expression (2).

$$H_\pm \approx E_0 \pm \hbar v_2(k_z \mp k_0) + \hbar v_\perp(k_x\sigma_x+k_y\sigma_y) \pm \hbar v_1(k_z \mp k_0)\sigma_z \quad (2)$$

$$\hbar = \frac{h}{2\pi}; \sigma_x, \sigma_y, \sigma_z: \text{Pauli matrix}$$

Here, $v_1$, $v_2$, and $v_\perp$ are three independent velocity parameters, and h is the Planck constant. According to the first-principles calculations of Co$_2$MnGa described above, the Weyl fermions are located at $\pm k_0 \sim (2\pi/a)\times 0.15$ in the vicinity of $E_0 \approx 20$ meV, and a tilt parameter $v_2/v_1=0.99$ and $v_1 \approx 10^5$ m/s are obtained. The tilt parameter $v_2/v_1=1$ corresponds to a quantum critical point, $v_2/v_1<1$ corresponds to type-I Weyl fermions, and $v_2/v_1>1$ corresponds to type-II Weyl fermions. In the type-I Weyl fermions ($v_2/v_1<1$), the density of states at the Weyl points is zero, whereas in the type-II Weyl fermions ($v_2/v_1>1$), the density of states at the Weyl points is finite so that electron and hole pockets touch.

Figure 6B:
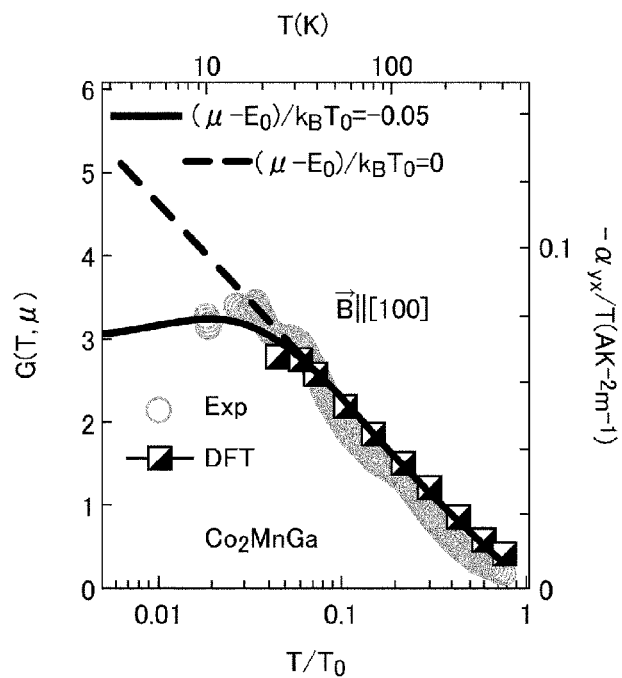
FIG. 6B is a graph illustrating the temperature dependence of the Peltier coefficient in FIG. 6A in terms of a scaling function near a quantum critical point.

At the quantum critical point ($v_2/v_1=1$), the energy derivative of the Hall conductivity $\partial\sigma_{yx}/\partial E$ displays log divergent behavior at low energy. The low energy theory suggests that $\alpha_{yx}(T, \mu)$ indicating temperature and chemical potential dependence of the Peltier coefficient in the vicinity of the quantum critical point can be expressed in terms of a dimensionless scaling function G over a wide range of temperatures (see FIG. 6B). Here, μ is the chemical potential. FIG. 6B shows that the scaling functions obtained from experiment ($T_0$=550 k) and density functional theory (DFT) calculations ($T_0$=6000 K) match with the results from the low energy theory over a decade of temperatures (solid line in FIG. 6B when $(\mu-E_0)/k_B T_0$=−0.05).

That is, based on the scaling function of the low energy theory, the logarithmic divergence of $\partial\sigma_{yx}/\partial E$ at the quantum critical point can lead to $\alpha_{yx}$~T log(|$E_F$−$E_0$|/(h$v_1 k_0$/2π)) behavior at low temperatures. On the other hand, this logarithmic divergence can lead to $\alpha_{yx}$~T log($k_B$T/(h$v_1 k_0$/2π)) behavior at high temperatures $k_B$T>|$E_F$−$E_0$|, which does not follow the Mott formula ($\alpha_{yx}$~T). Thus, the temperature dependence of $\alpha_{yx}$ can be understood in terms of a scaling function of the low energy theory in the vicinity of the quantum critical point between the type I and the type II over a decade of temperatures.

When the chemical potential μ is tuned to the Weyl points (μ=$E_0$), the scaling function does not follow the Mott formula even at any low temperature (broken line in FIG. 6B).

Figure 9:
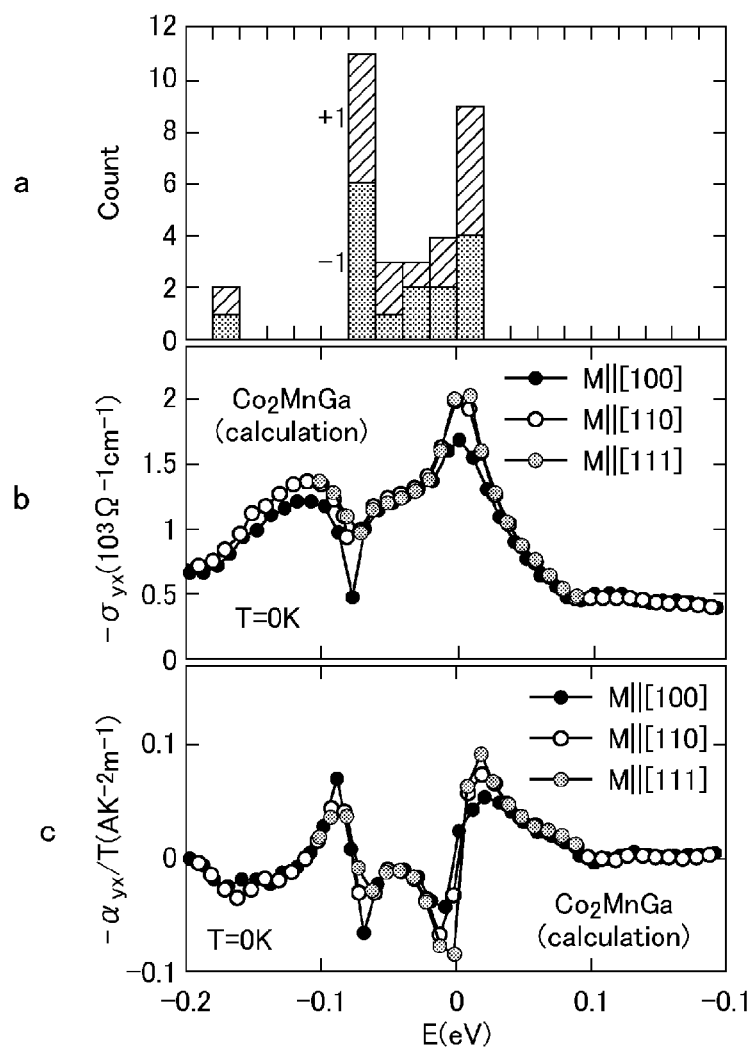
FIG. 9 shows graphs illustrating energy dependence of the number of Weyl points and energy dependence of the Hall conductivity and $-\alpha_{yx}/T$ of the thermoelectric conversion element at absolute zero, the latter energy dependence being obtained from the first-principles calculations.

A graph a in FIG. 9 shows energy dependence of the number of Weyl points for the magnetization along [110], a graph b in FIG. 9 shows energy dependence of −$\sigma_{yx}$ at T=0 K, and a graph c in FIG. 9 shows energy dependence of −$\alpha_{yx}$/T at T=0 K. In the graph a of FIG. 9, the chirality (right handed and left handed) of Weyl points is denoted by +1 and −1. According to the graphs a, b and c, −$\alpha_{yx}$/T has a sharp peak and the number of Weyl points is large in the vicinity of $E_0$~0.02 eV. Further, in the vicinity of E~−0.1 eV, −$\alpha_{yx}$/T has an extreme value and the number of Weyl points is much larger. Thus, the Weyl points can exist within the range of ±0.1 eV from the Fermi energy $E_F$.

Figure 10A:
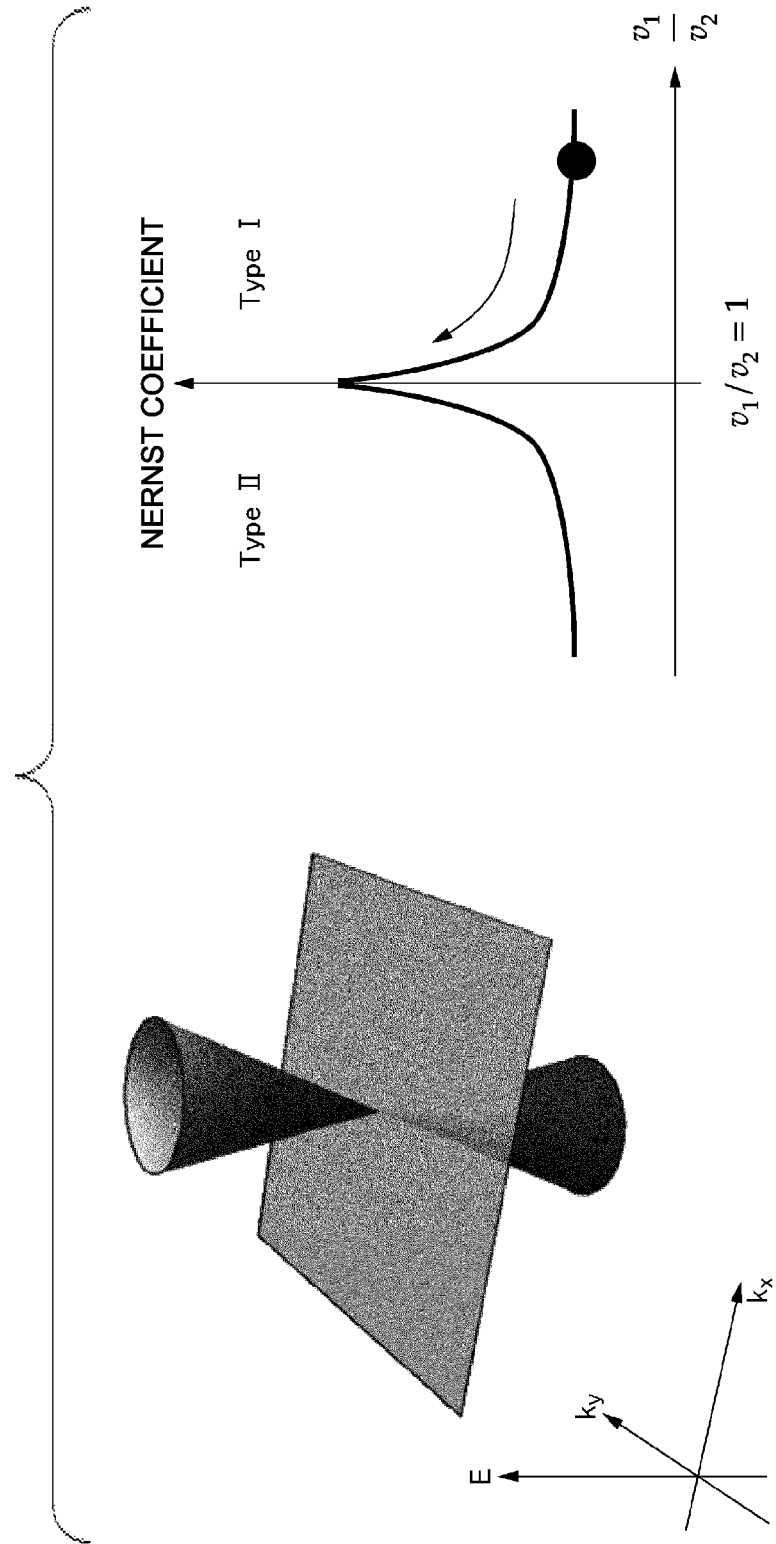
FIG. 10A is a schematic view illustrating a relation between a band dispersion and the Nernst coefficient in type-I phase.
Figure 10B:
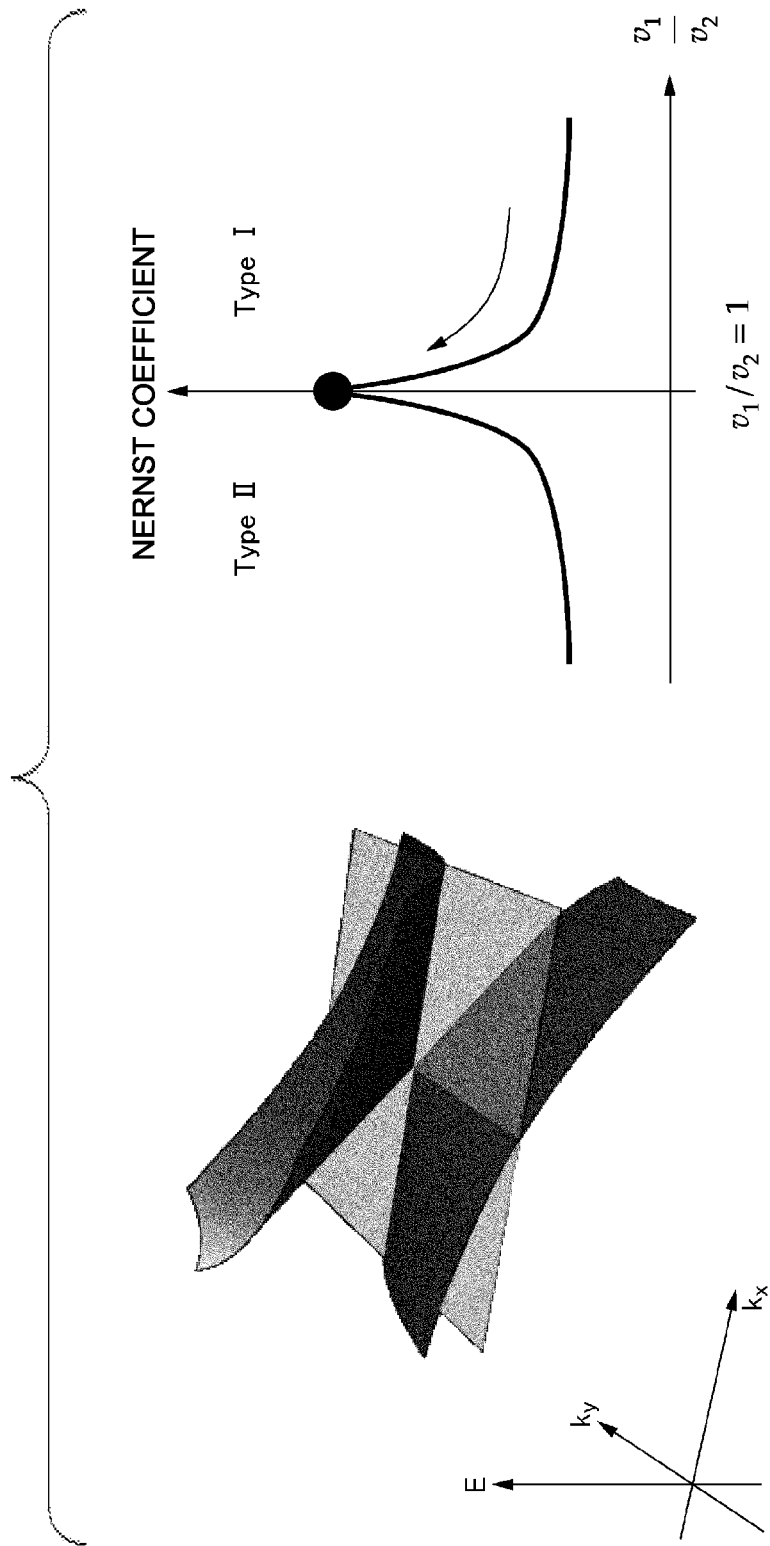
FIG. 10B is a schematic view illustrating a relation between a band dispersion and the Nernst coefficient at the quantum critical point.

FIGS. 10A and 10B each schematically shows a relation between the band dispersion and the Nernst coefficient. As shown in FIG. 10A, with respect to the type-I Weyl fermions separated from the quantum critical point ($v_1$=$v_2$), two energy bands are in point contact with each other, and the density of states at the Weyl points is zero. The Nernst coefficient in this case is about 0.7 μV/K. The Nernst coefficient increases with approaching the quantum critical point. At the quantum critical point (FIG. 10B), the two energy bands provide flat dispersion, and the density of states at the Weyl points increases. At this point, the Nernst coefficient has a local maximum value, reaching about 7 μV/K. Thus, the flat dispersion increases the Nernst coefficient by one order of magnitude.

As described above, the first-principles calculations of $Co_2MnGa$ show the existence of the type-I Weyl fermions, which are located at ±$k_0$~(2π/a)×0.15 in the vicinity of $E_0$≈20 meV and have the tilt parameter of $v_2/v_1$=0.99, thereby obtaining the Nernst coefficient in the vicinity of the quantum critical point.

To provide further evidence for the existence of Weyl fermions in $Co_2MnGa$, measurements of magnetic field dependence of the longitudinal conductivity $\sigma_{xx}$ with different electric current directions and measurements of angle dependence of magneto-conductivity $\sigma_{xx}(B)-\sigma_{xx}(0)$ with different electric current directions were performed on the thermoelectric conversion element 1.

Figure 11A:
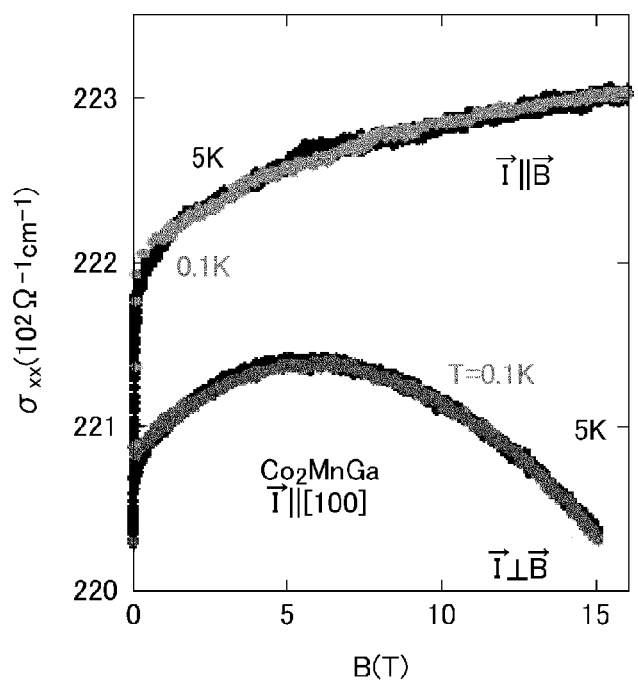
FIG. 11A is a graph illustrating results of measurement of magnetic field dependence of longitudinal conductivity of the thermoelectric conversion element with different electric current directions.
Figure 11B:
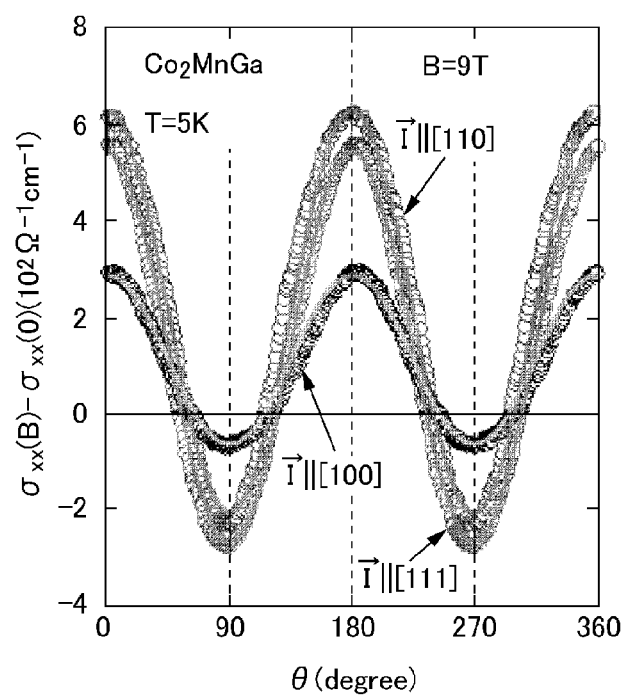
FIG. 11B is a graph illustrating results of measurement of angle dependence (angle between magnetic field and electric current) of magneto-conductivity of the thermoelectric conversion element with different electric current directions.

FIG. 11A is a graph illustrating the results of the measurements of the magnetic field dependence of the longitudinal conductivity $\sigma_{xx}$ at T=0.1 K and T=5 K when the magnetic field B and the electric current I are parallel to each other (I∥B) and when the magnetic field B and the electric current I are perpendicular to each other (I⊥B). FIG. 11B is a graph illustrating the results of the measurements of the angle dependence (an angle θ between the magnetic field B and the electric current I) of the magneto-conductivity at T=5 K and |B|=9 T for I∥[100], I∥[110], and I∥[111]. θ=0°, 180° and 360° correspond to I∥B, and θ=90° and 270° correspond to I⊥B. FIG. 11B indicates that the magneto-conductivity displays $\cos^2\theta$ behavior. As is clear from FIGS. 11A and 11B, the electric current I is allowed to flow easily in high magnetic fields (e.g., above |B|~6 T) when the magnetic field B is parallel to the electric current I. This implies occurrence of chiral anomaly that appears in a material containing Weyl fermions.

Figure 12:
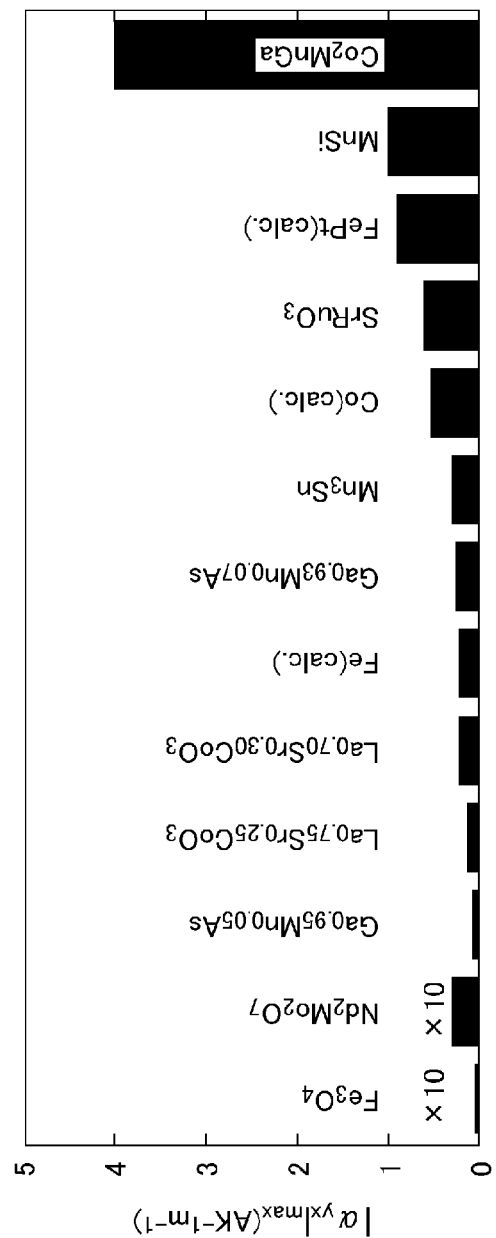
FIG. 12 is a graph illustrating comparison of magnitude of the Peltier coefficient for various ferromagnets and antiferromagnet $Mn_3Sn$.

FIG. 12 shows comparison of magnitude of the Peltier coefficient |$\alpha_{yx}$| for various ferromagnets and antiferromagnet $Mn_3Sn$. As is clear from FIG. 12, the magnitude of the Peltier coefficient of $Co_2MnGa$ is significantly greater than those of the other ferromagnets and the antiferromagnet $Mn_3Sn$.

Next, reference will be made to a thermoelectric conversion device including the thermoelectric conversion element according to the embodiments in the form of modules.

Figure 13:
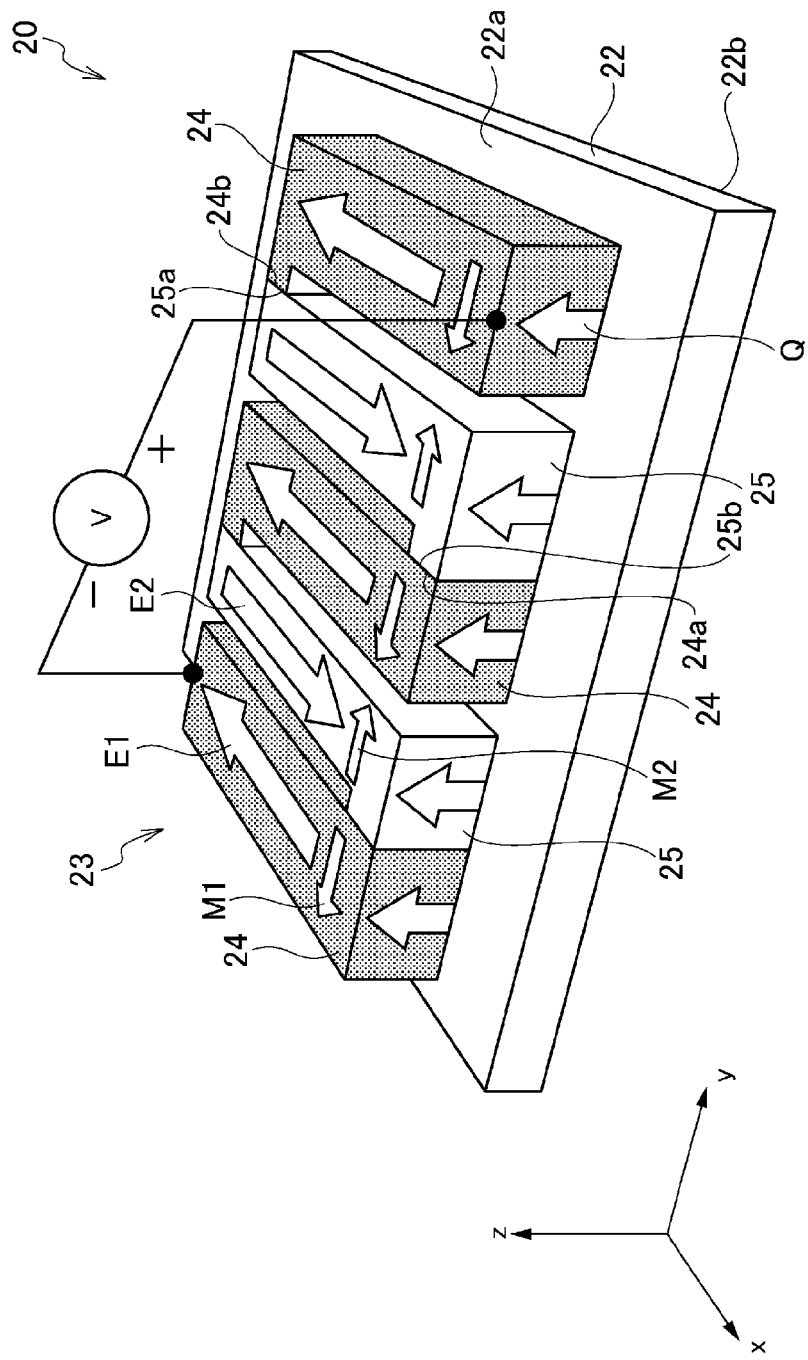
FIG. 13 is an exterior view illustrating an example of a thermoelectric conversion device including the thermoelectric conversion element according to the embodiments.

FIG. 13 shows an exterior configuration of a thermoelectric conversion device 20 according to the embodiments. The thermoelectric conversion device 20 includes a substrate 22 and a power generator 23 placed on the substrate 22. In the thermoelectric conversion device 20, when the heat current Q flows from the substrate 22 side toward the power generator 23, a temperature difference is created in the power generator 23 in the direction of the heat current, and an electric voltage V is generated in the power generator 23 by the anomalous Nernst effect.

The substrate 22 has a first surface 22a on which the power generator 23 is placed, and a second surface 22b opposite to the first surface 22a. Heat from a heat source (not shown) is applied onto the second surface 22b.

The power generator 23 includes a plurality of thermoelectric conversion elements 24 and a plurality of thermoelectric conversion elements 25, each having a three-dimensional L shape and being made of a material identical to that of the thermoelectric conversion element 1 shown in FIG. 3. As shown in FIG. 13, the plurality of thermoelectric conversion elements 24 and the plurality of thermoelectric conversion elements 25 are alternately arranged in parallel to one another on the substrate 22 in a direction (direction y) perpendicular to a longitudinal direction (direction x) of the thermoelectric conversion elements. The number of the thermoelectric conversion elements 24 and 25 that constitute the power generator 23 is not limited to a specific number.

The plurality of thermoelectric conversion elements 24 and the plurality of thermoelectric conversion elements 25 are arranged such that magnetization M1 of the thermoelectric conversion elements 24 is oriented opposite to a direction of magnetization M2 of the thermoelectric conversion elements 25. Further, the plurality of thermoelectric conversion elements 24 has the Nernst coefficient with the same sign as that of the Nernst coefficient of the plurality of thermoelectric conversion elements 25.

Each of the thermoelectric conversion elements 24 has a first end face 24a and a second end face 24b, both of which are parallel to the longitudinal direction (direction x) of each of the thermoelectric conversion elements 24. Each of the thermoelectric conversion elements 25 has a first end face 25a and a second end face 25b, both of which are parallel to the longitudinal direction (direction x) of each of the thermoelectric conversion elements 25. The first end face 25a of the thermoelectric conversion element 25 is connected to the second end face 24b of one thermoelectric conversion element 24 adjacent thereto on one side thereof, and the second end face 25b of the thermoelectric conversion element 25 is connected to the first end face 24a of another thermoelectric conversion element 24 adjacent thereto on the opposite side thereof. With this structure, the plurality of thermoelectric conversion elements 24 and the plurality of thermoelectric conversion elements 25 are electrically connected in series to one another. That is, the power generator 23 is provided on the first surface 22a of the substrate 22 in a serpentine shape.

When heat is applied from the heat source onto the second surface 22b of the substrate 22, the heat current Q flows in the direction +z toward the power generator 23. When the heat current Q creates a temperature difference, the anomalous Nernst effect causes each of the thermoelectric conversion elements 24 to generate electromotive force E1 in the direction (direction −x) perpendicular to both the direction of the magnetization M1 (direction −y) and the direction of the heat current Q (direction +z). The anomalous Nernst effect causes each of the thermoelectric conversion elements 25 to generate electromotive force E2 in the direction (direction +x) perpendicular to both the direction of the magnetization M2 (direction +y) and the direction of the heat current Q (direction +z).

Since the thermoelectric conversion elements 24 and the thermoelectric conversion elements 25, which are arranged in parallel to one another, are electrically connected in series to one another as described above, the electromotive force E1 generated in one thermoelectric conversion element 24 can be applied to the adjacent thermoelectric conversion element 25. Since the direction of the electromotive force E1 generated in the one thermoelectric conversion element 24 is opposite to the direction of the electromotive force E2 generated in the adjacent thermoelectric conversion element 25, the electromotive force in the thermoelectric conversion element 24 and the electromotive force in the adjacent thermoelectric conversion element 25 are added up, thereby increasing an output voltage V.

As a modification of the thermoelectric conversion device 20 in FIG. 13, another configuration may be employed in which the plurality of thermoelectric conversion elements 24 and the plurality of thermoelectric conversion elements 25 are arranged such that the thermoelectric conversion element 24 has the Nernst coefficient which is opposite in sign to the Nernst coefficient of the thermoelectric conversion element 25, and the thermoelectric conversion element 24 and the thermoelectric conversion element 25 share the same direction of magnetization (that is, the magnetization M1 and the magnetization M2 have the same direction).

Aspects of the thermoelectric conversion device according to the embodiments should not be limited to the above-described embodiment shown in FIG. 13. The anomalous Nernst effect allows temperature gradient, a direction of magnetization, and a direction of an electric voltage to be perpendicular to one another, which makes it possible to produce a thin sheet-shaped thermoelectric conversion element.

Figure 14:
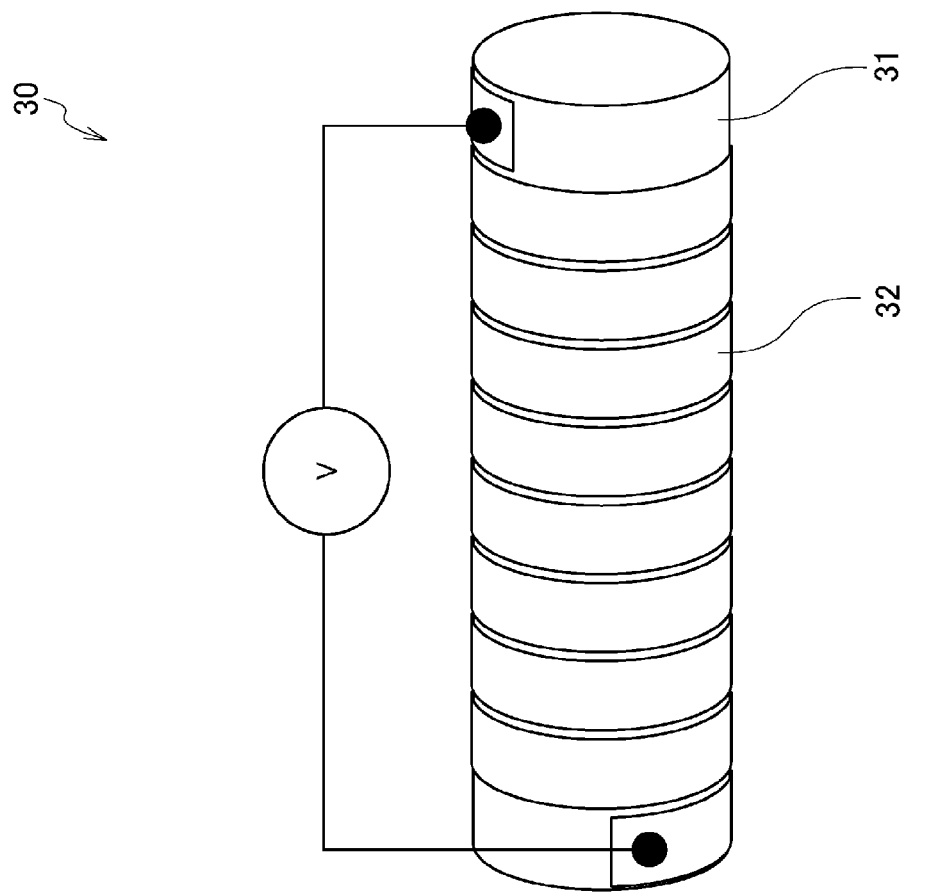
FIG. 14 is an exterior view illustrating another example of a thermoelectric conversion device including the thermoelectric conversion element according to the embodiments.

FIG. 14 shows an exterior configuration of a thermoelectric conversion device 30 including a sheet-shaped thermoelectric conversion element 32. Specifically, the thermoelectric conversion device 30 includes a hollow member 31 and an elongated sheet-shaped thermoelectric conversion element 32 covering (winding around) an outer surface of the hollow member 31. The thermoelectric conversion element 32 is made of a material identical to that of the thermoelectric conversion element 1 shown in FIG. 3. A direction of magnetization of the thermoelectric conversion element 32 is parallel to a longitudinal direction (direction x) of the hollow member 31. When heat current flows in a direction perpendicular to the longitudinal direction (direction x) of the hollow member 31 and a temperature gradient is created in a direction from inside to outside the hollow member 31, the anomalous Nernst effect generates an electric voltage V along a longitudinal direction of the elongated thermoelectric conversion element 32 (i.e., a direction perpendicular to the direction of magnetization and the direction of heat current).

In FIGS. 13 and 14, let a longitudinal length of the thermoelectric conversion element(s) be denoted by L, and a thickness (height) of the thermoelectric conversion element(s) be denoted by H. The electric voltage generated by the anomalous Nernst effect is proportional to L/H. That is, the longer and thinner the thermoelectric conversion element(s), the greater the generated voltage. Hence, the anomalous Nernst effect is expected to be enhanced by employing the power generator 23 (FIG. 13) including the plurality of thermoelectric conversion elements 24 and the plurality of thermoelectric conversion elements 25 which are electrically connected in series to one another in a serpentine shape or employing the elongated sheet-shaped thermoelectric conversion element 32 (FIG. 14).

The thermoelectric conversion device 20 and the thermoelectric conversion device 30 can be used for a variety of apparatuses. For example, a heat flux sensor provided with the thermoelectric conversion device enables evaluation of heat insulation performance of buildings. Further, an exhaust system of a motorcycle or other vehicles provided with the thermoelectric conversion device allows utilization of heat of exhaust gas (waste heat) for power generation. It is therefore possible to make effective use of the thermoelectric conversion device as an auxiliary power supply.

The embodiments have focused on the electric voltage generated by the anomalous Nernst effect. Instead, the output voltage can be increased by virtue of synergy among the electric voltage generated by the Seebeck effect resulting from a temperature difference, the Hall effect that occurs based on the electric voltage generated by the Seebeck effect, and the electric voltage generated by the anomalous Nernst effect.

The embodiments have been described in which $Co_2MnGa$ is a material that enhances the anomalous Nernst effect based on the existence of Weyl fermions. In addition to $Co_2MnGa$, examples of potential materials that are likely to enhance the anomalous Nernst effect based on the existence of Weyl fermions may include $Co_2MnAl$, $Co_2MnIn$, $Mn_3Ga$, $Mn_3Ge$, $Fe_2NiGa$, $CoTiSb$, $CoVSb$, $CoCrSb$, $CoMnSb$, and $TiGa_2Mn$.

REFERENCE SIGNS LIST 1, 24, 25, 32 Thermoelectric conversion element
20, 30 Thermoelectric conversion device
22 Substrate
23 Power generator
31 Hollow member

The invention claimed is:
1. A thermoelectric conversion element made of a magnetic material with a band structure having Weyl points which exist within a range of ±0.1 eV from Fermi energy,
wherein the thermoelectric conversion element has a thermoelectric mechanism for generating electromotive force by anomalous Nernst effect.

2. The thermoelectric conversion element according to claim 1, wherein density of states of the magnetic material has energy dependence having an extreme value which exists within a range of ±0.1 eV from the Fermi energy.

3. The thermoelectric conversion element according to claim 1, wherein a thermoelectric coefficient that defines the electromotive force has temperature dependence proportional to T log T, where T is a temperature.

4. The thermoelectric conversion element according to claim 1, wherein the magnetic material shows ferromagnetism.

5. The thermoelectric conversion element according to claim 1, wherein the magnetic material has a cubic crystal structure.

6. The thermoelectric conversion element according to claim 1, wherein the magnetic material has a full Heusler crystal structure.

7. The thermoelectric conversion element according to claim 1, wherein the thermoelectric conversion element has a thickness greater than or equal to 0.1 µm.

8. A thermoelectric conversion device comprising:
a substrate; and
a power generator provided on the substrate and including thermoelectric conversion elements,
wherein each of the thermoelectric conversion elements has a shape extending in one direction, and is made of a magnetic material identical to that of the thermoelectric conversion element according to claim 1, and
in the power generator, the thermoelectric conversion elements are arranged in parallel to one another in a direction perpendicular to the one direction and electrically connected in series to one another in a serpentine shape.

9. A thermoelectric conversion device comprising:
the thermoelectric conversion element according to claim 1; and
a hollow member,
wherein the thermoelectric conversion element is a sheet-shaped element covering an outer surface of the hollow member.

* * * * *